(12) United States Patent
Bae et al.

(10) Patent No.: US 9,165,809 B2
(45) Date of Patent: Oct. 20, 2015

(54) SIDE ROLLER AND SUBSTRATE TRANSPORT DEVICE INCLUDING THE SAME

(71) Applicant: Samsung Display Co., Ltd., Yongin, Gyeonggi-do (KR)

(72) Inventors: Jin Woo Bae, Yongin (KR); Won Ho Kim, Yongin (KR); Bong Cheol Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 49 days.

(21) Appl. No.: 14/095,344

(22) Filed: Dec. 3, 2013

(65) Prior Publication Data

US 2014/0346006 A1 Nov. 27, 2014

(30) Foreign Application Priority Data

May 27, 2013 (KR) ........................ 10-2013-0059706

(51) Int. Cl.
| | |
|---|---|
| *B65G 39/18* | (2006.01) |
| *B65G 39/09* | (2006.01) |
| *H01L 21/677* | (2006.01) |
| *B65G 21/20* | (2006.01) |

(52) U.S. Cl.
CPC ...... *H01L 21/67706* (2013.01); *B65G 21/2072* (2013.01); *B65G 39/09* (2013.01); *B65G 39/18* (2013.01)

(58) Field of Classification Search
CPC .... B65G 21/2072; B65G 39/09; B65G 39/18; B65G 13/00

USPC .......... 193/37 C, 35 R, 37; 198/836.1, 836.3, 198/836.4, 782, 785
See application file for complete search history.

(56) References Cited

U.S. PATENT DOCUMENTS

| | | | | |
|---|---|---|---|---|
| 935,669 | A | * | 10/1909 | Logan .......................... 193/35 C |
| 2,076,180 | A | * | 4/1937 | Griswold ...................... 384/451 |
| 5,346,161 | A | * | 9/1994 | Eilenstein-Wiegmann et al. .......................... 244/137.1 |
| 8,172,063 | B2 | * | 5/2012 | Ho ............................... 193/35 R |
| 8,308,221 | B2 | | 11/2012 | Kitayama |
| 8,316,504 | B1 | | 11/2012 | Pohlman |
| 8,336,806 | B2 | | 12/2012 | Dierksmeier |
| 8,777,541 | B2 | * | 7/2014 | Cheng ...................... 414/331.11 |
| 2001/0053257 | A1 | | 12/2001 | Takatsu |

FOREIGN PATENT DOCUMENTS

| | | | | |
|---|---|---|---|---|
| DE | 102011018638 A1 | * | 11/2011 | ............. B65G 39/18 |
| JP | 1987-0135618 | | 5/1987 | |
| JP | 2008-039055 | | 2/2008 | |
| JP | 2011-190848 | | 9/2011 | |
| KR | 1998-0048136 | | 9/1998 | |
| KR | 20-0169361 | | 3/2000 | |
| KR | 1020110056029 A | * | 5/2011 | ............. B65G 49/06 |
| KR | 30-2013-0000113 | | 1/2013 | |

* cited by examiner

*Primary Examiner* — Mark A Deuble
(74) *Attorney, Agent, or Firm* — Knobbe Martens Olson & Bear LLP

(57) ABSTRACT

A side roller moves up and down and a substrate transport device including the same prevents a substrate from being broken due to a foreign material decreasing wear of the side roller by transportation of the substrate. The side roller improves a yield of a transportation process.

16 Claims, 10 Drawing Sheets

SIDE ROLLER AND SUBSTRATE TRANSPORT DEVICE INCLUDING THE SAME

CROSS-REFERENCE TO RELATED APPLICATIONS

This application claims priority to, and the benefit of, Korean Patent Application No. 10-2013-0059706 filed in the Korean Intellectual Property Office on May 27, 2013, the entire contents of which are incorporated herein by reference.

BACKGROUND

1. Field

The present disclosure relates to a side roller and a substrate transport device including the same.

2. Description of the Related Technology

Substrate transport devices are devices that transport substrates such as a wafer for manufacturing a semiconductor, or a glass substrate for manufacturing a flat panel display. The device for transporting the glass substrate for manufacturing a flat panel display includes a substrate side supporting member that supports the side of the substrate at the time of transporting the substrate.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One embodiment of the present invention provides a side roller including: an inner wheel including at least one first inner wheel guide groove; an outer wheel surrounding the at least one inner wheel and including at least one first outer wheel guide groove corresponding to the at least one first inner wheel guide groove; and a ball positioned between the at least one first inner guide groove and the at least one first outer wheel guide groove, and a distance between the at least one first inner wheel guide groove and a lower circumferential surface of the at least one inner wheel is variable.

The side roller may further include a housing coupled with the outer wheel in a circumferential direction.

The outer wheel may further include a joining groove formed on an outer peripheral surface of the outer wheel, and the outer wheel and the housing may be joined through the joining groove.

The inner wheel may further include a center hole and may be coupled with a rotational shaft through the center hole.

The side roller may further include at least one second inner wheel guide groove and at least one second outer wheel guide groove, and the second inner wheel guide groove and the second outer wheel guide groove may be parallel to a lower circumferential surface of the inner wheel.

The housing may move up and down.

The side roller may include a plurality of balls and a retainer positioned between the plurality of balls.

A material of the outer wheel, the inner wheel, and the housing may each comprise at least one of metal, non-metal, ceramic, or plastic.

Another embodiment of the present invention provides a substrate transport device including: a plurality of rotatable first shafts; a transport roller that rotates in connection with the plurality of rotatable first shafts; a second shaft disposed vertical to the longitudinal direction of the plurality of first shafts; and a side roller that rotates in connection with the second shaft, and an external surface of the side roller moves up and down.

The side roller may include an inner wheel including at least one first inner wheel guide groove, an outer wheel surrounding the inner wheel and including at least one first outer wheel guide groove corresponding to the at least one first inner wheel guide groove, and at least one ball positioned between the at least one first inner wheel guide groove and the at least one first inner wheel guide groove, wherein a distance between the first inner wheel guide groove and a lower circumferential surface of the inner wheel may be changed.

The side roller may further include a housing coupled with the outer wheel in a circumferential direction.

The outer wheel may further include a joining groove formed on an outer peripheral surface of the outer wheel, and the outer wheel and the housing may be joined through the joining groove.

The inner wheel may further include a center hole and may be coupled with a rotational shaft through the center hole.

The side roller may further include at least one second inner wheel guide groove and at least one second outer wheel guide groove, wherein the at least one second inner wheel guide groove and the at least one second outer wheel guide groove may be parallel to a lower circumferential surface of the inner wheel.

The housing may move up and down.

The substrate transport device may include a plurality of balls, and the side roller may further include a retainer positioned between the plurality of balls.

A material of the outer wheel, the inner wheel, and the housing may each comprise at least one of metal, non-metal, ceramic, or plastic.

According to certain embodiments of the present invention, wear of a slide roller is reduced to thereby increase a persisting period, as compared with a slide roller according to a comparative example, by approximately 28 times. When the side roller according to certain embodiments of the present invention is used, a foreign-material fault is reduced by the particles, and the like, and a substrate fault is reduced, thereby improving reliability of the device. Further, yearly part cost and labor costs are saved through providing a side roller having an improved persisting period.

DETAILED DESCRIPTION OF CERTAIN INVENTIVE EMBODIMENTS

Figure 1:
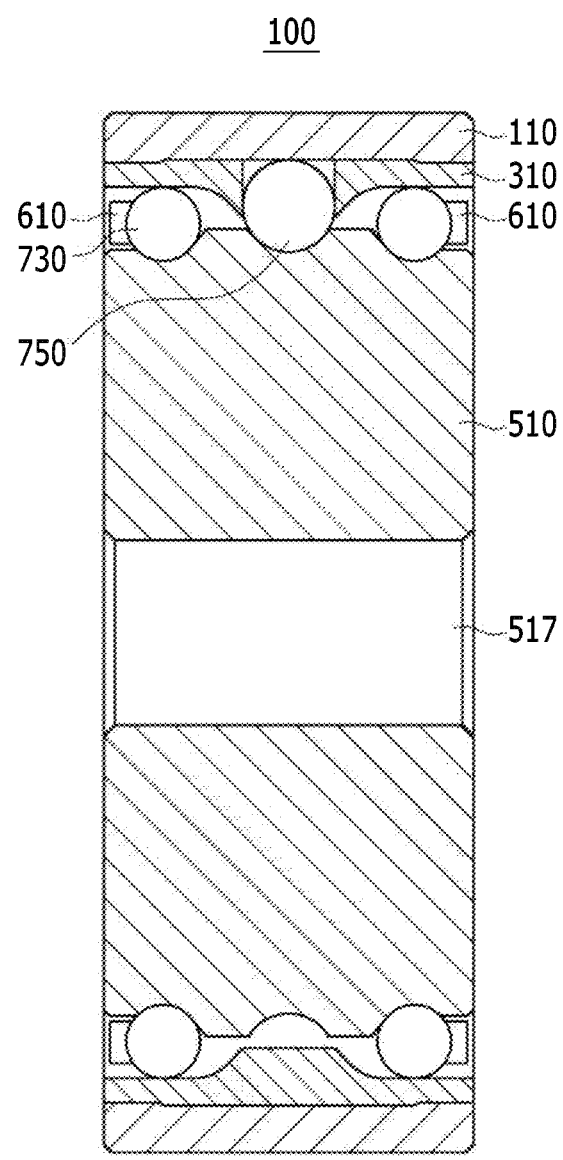
FIG. 1 is a cross-sectional view of a side roller according to an embodiment of the present invention.

Embodiments of the present invention will be described more fully hereinafter with reference to the accompanying drawings, in which certain embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In some substrate transport devices, the substrate side supporting member includes a side roller that rotates while contacting the side of the substrate during a process and a support shaft that supports the side roller. The substrate side supporting member is disposed in a line along both sides of the substrate. During the process, when the substrate is transported by a substrate transport member, the substrate side supporting member supports both sides of the substrate to prevent the substrate from deviating from a predetermined movement route.

However, since a side roller that guides transportation of a substrate contacts the substrate while freely rotating as described above, the sides of the substrate are worn, and as a result, particles generated from the wear are attached to the substrate to thereby cause a fault.

Further, wear of the side roller is accelerated and a replacement cycle is shortened, and as a result, labor costs and part replacement cost increase.

Embodiments of the present invention have been made in an effort to reduce wear due to substrate transportation, and to provide a side roller which is movable vertically, and a substrate transport device including the same in order to reduce the wear.

A side roller 100 according to an embodiment of the present invention will be described in detail with reference to FIGS. 1 to 6.

Figure 2:
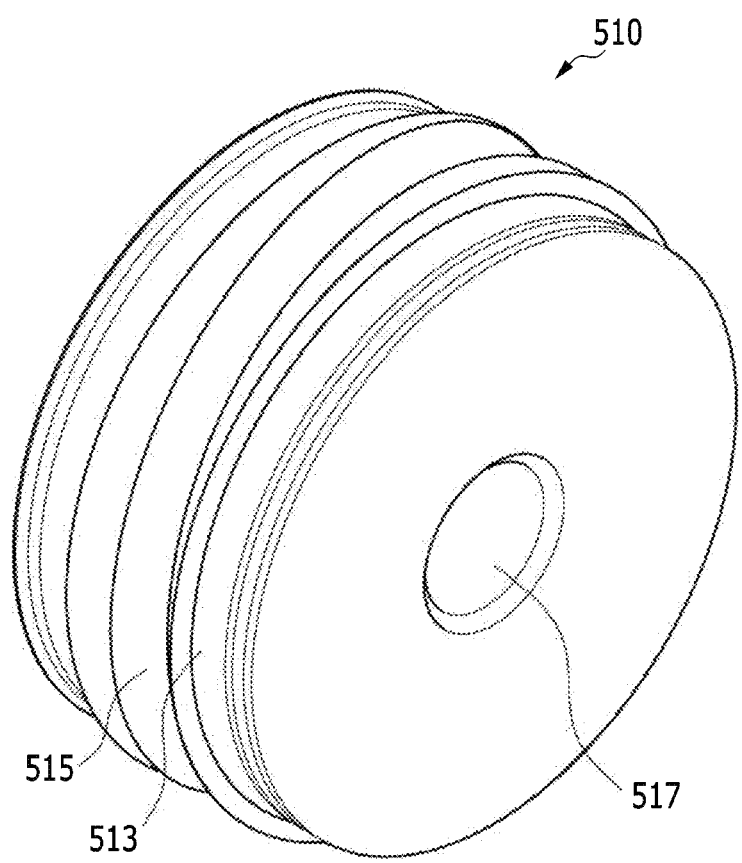
FIG. 2 is a perspective view of an inner wheel according to an embodiment of the present invention.
Figure 3:
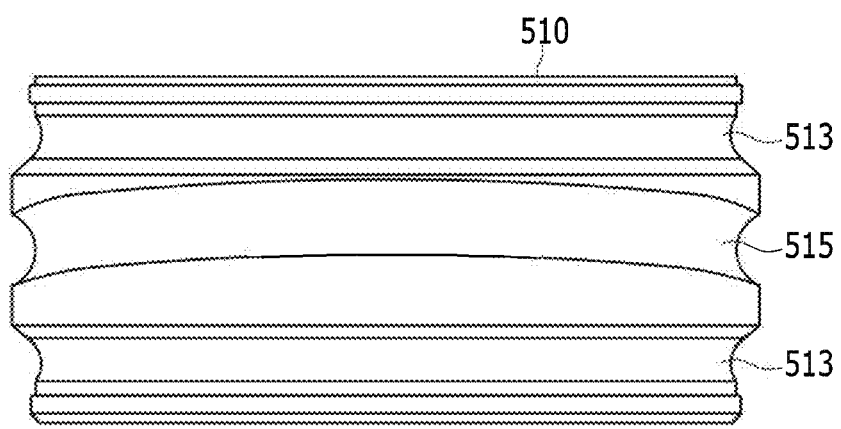
FIG. 3 is a side view of the inner wheel according to an embodiment of the present invention.
Figure 4:
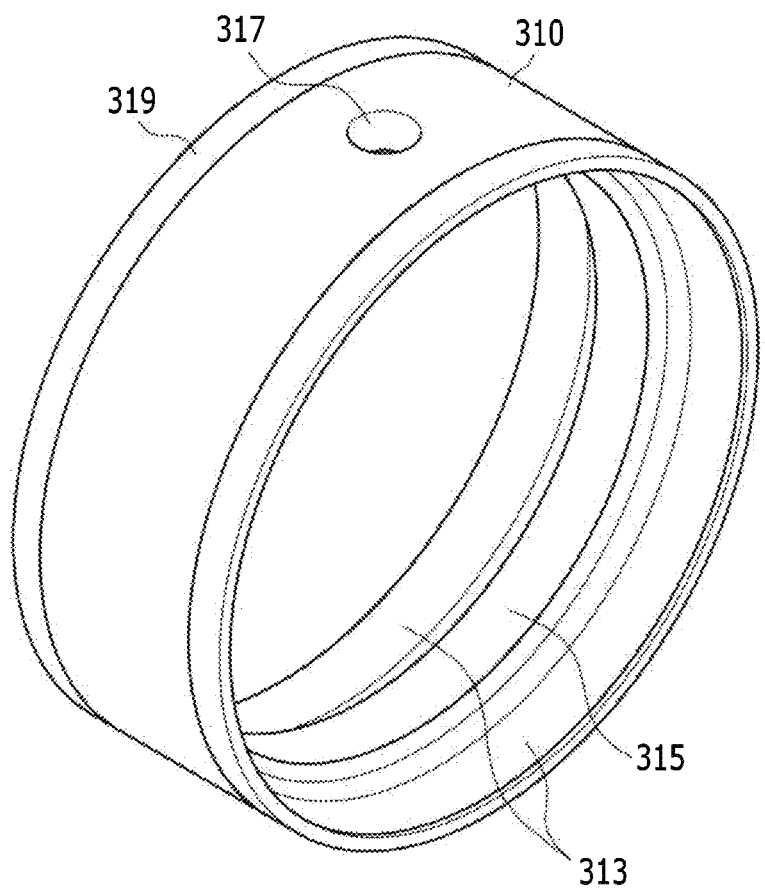
FIG. 4 is a perspective view of an outer wheel according to an embodiment of the present invention.
Figure 5:
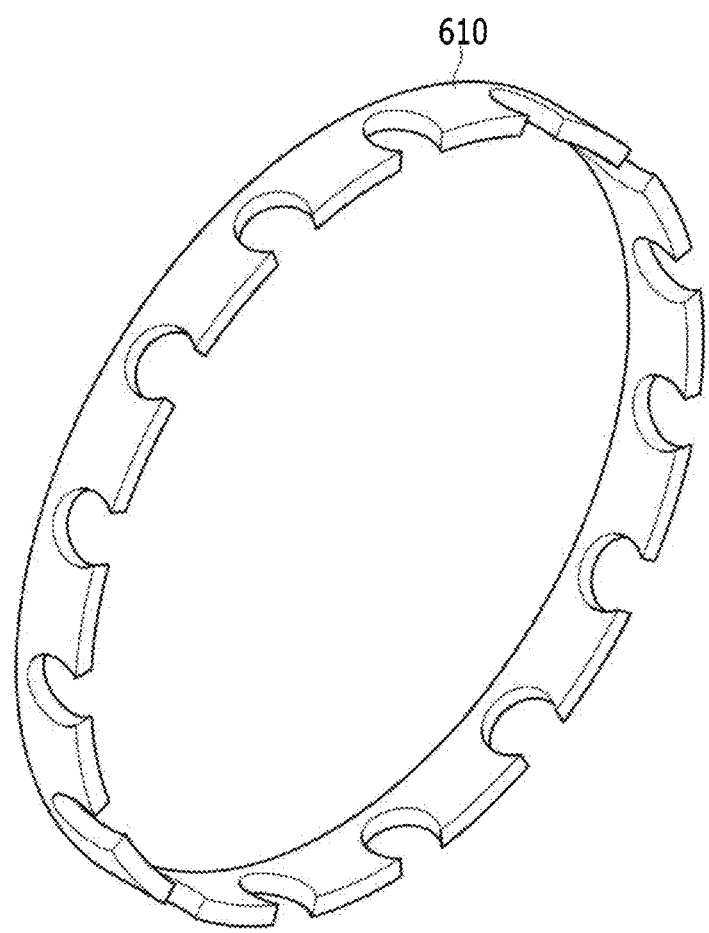
FIG. 5 is a perspective view of a retainer according to an embodiment of the present invention.
Figure 6:
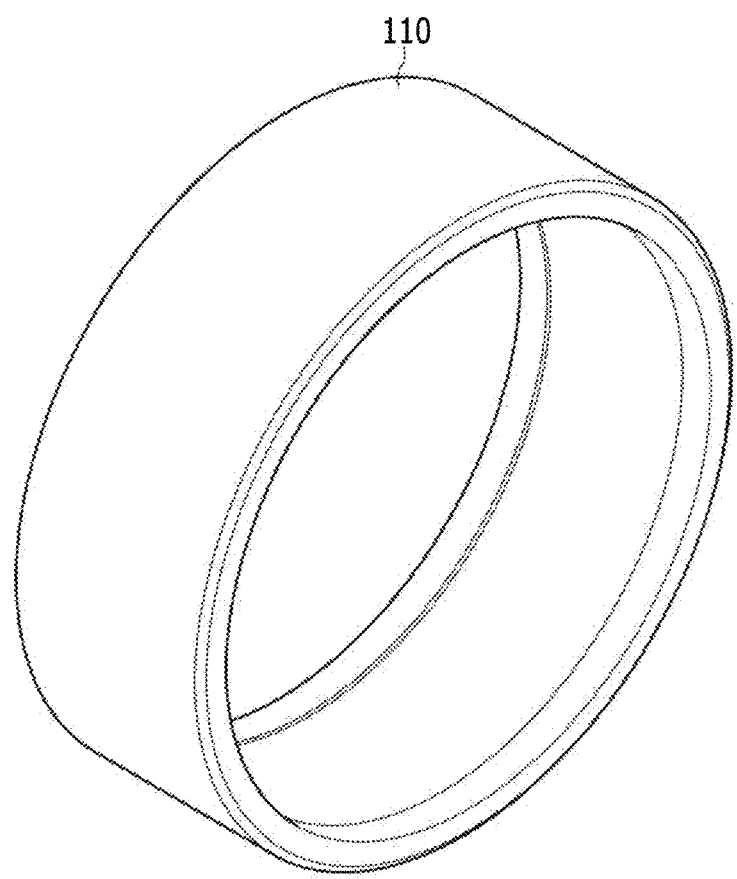
FIG. 6 is a perspective view of a housing according to an embodiment of the present invention.

FIG. 1 is a cross-sectional view of a side roller according to an embodiment of the present invention, FIG. 2 is a perspective view of an inner wheel, FIG. 3 is a side view of the inner wheel, FIG. 4 is a perspective view of an outer wheel, FIG. 5 is a perspective view of a retainer, and FIG. 6 is a perspective view of a housing.

The side roller 100 according to an embodiment of the present invention includes a housing 110, an outer wheel 310, an inner wheel 510, a retainer 610, and balls 730 and 750.

Referring to FIGS. 1 to 3, the inner wheel 510 according to an embodiment of the present invention will be described.

As illustrated in FIG. 2, the inner wheel 510 is cylindrical, in particular, hollow cylindrical. As a result, the inner wheel 510 may further include a center hole 517.

The center hole 517 is coupled with a rotational shaft to rotate the inner wheel 510. That is, the center hole 517 is coupled with the rotational shaft through an inner peripheral surface of the inner wheel 510. Referring to FIG. 1, the side roller 100 according to an embodiment of the present invention is connected with the rotational shaft through the center hole 517 of the inner wheel 510 and the rotational shaft transfers rotational force to the connected inner wheel 510 while rotating. In the substrate transport device 10 according to an embodiment of the present invention, the rotational shaft may be a second shaft 50 (referring to FIG. 10) and the second shaft 50 will be described in describing the substrate transport device 10.

As illustrated in FIG. 3, the inner wheel 510 includes a first inner wheel guide groove 515 and a second inner wheel guide groove 513.

There may be at least one first inner wheel guide groove 515, and the first inner wheel guide groove 515 is formed in a ring shape which is oblique with respect to a lower or upper circumferential surface of the inner wheel 510 and may be arranged to form a plurality of columns.

The first inner wheel guide groove 515 which is obliquely formed has a height different from the lower circumferential surface of the inner wheel 510. That is, a distance between the first inner wheel guide groove 515 and the lower circumferential surface of the inner wheel 510 is changed. A distance between the first inner wheel guide groove 515 and the upper circumferential surface of the inner wheel 510 is also changed similarly.

In other words, the first inner wheel guide groove 515 is formed to have a spaced distance which is changed with respect to the upper or lower circumferential surface of the inner wheel 510. However, when the first inner wheel guide groove 515 forms a close curve in a ring shape, points having the same spaced distance with respect to the lower or upper circumferential surface of the inner wheel 510 may be at least two.

The distance between the first inner wheel guide groove 515 and the upper or lower circumferential surface of the inner wheel 510 is not limited and this is means that a degree at which the ring-shaped first inner wheel guide groove 515 is inclined to the circumferential surface of the inner wheel 510 is not limited. According to the first inner wheel guide groove 515 which is largely inclined, a vertical movement range of the ball 750 that moves on the first inner wheel guide groove 515 is large and according to the first inner wheel guide groove 515 which is slightly inclined, the vertical movement range of the ball 750 that moves on the first inner wheel guide groove 515 is a little smaller.

There may be at least one second inner wheel guide groove 513, and the second inner wheel guide groove 513 is formed in a ring shape parallel to the lower or upper circumferential surface of the inner wheel 510. That is, a distance between the second inner wheel guide groove 513 and the lower or upper circumferential surface of the inner wheel 510 is similar at any point.

Referring to FIGS. 2 and 3, the inner wheel 510 includes one first inner wheel guide groove 515 and two second inner wheel guide grooves 513 according to an embodiment of the present invention. Two second inner wheel guide grooves 513 parallel to the circumferential surface of the inner wheel 510 are formed at both ends of an outer peripheral surface of the inner wheel 510 and the first inner wheel guide groove 515 is formed between two second inner wheel guide grooves 513. The first inner wheel guide groove 515 is formed obliquely to the upper or lower circumferential surface of the inner wheel 510 as compared with the second inner wheel guide grooves 513 formed at both ends.

In FIG. 2, one first inner wheel guide groove 515 that is inclined to the upper or lower circumferential surface of the inner wheel 510 is included, but the present invention is not limited thereto. That is, the plurality of first inner wheel guide grooves 515 may be formed to have a height different from the lower circumferential surface of the inner wheel 510.

Further, in FIG. 2, two second inner wheel guide grooves 513 are illustrated, but the present invention is not limited thereto as described above.

Further, in FIG. 2, one first inner wheel guide groove 515 is positioned between two second inner wheel guide grooves 513, but the present invention is not limited to the arrangement or order and the positions may be, of course, changed.

FIGS. 2 and 3 include three guide grooves 513 and 515, but the side roller 100 that moves vertically may be implemented by only one first inner wheel guide groove 515 that is inclined to the circumferential surface of the inner wheel 510. In this case, the second inner wheel guide groove 513 may not be included.

Further, a material of the inner wheel is not limited, but may be any one of, for example, metal, non-metal, ceramic, and plastic.

Next, referring to FIGS. 1 and 4, the outer wheel 310 according to the exemplary embodiment of the present invention will be described.

The outer wheel 310 has a hollow cylindrical structure as illustrated in FIG. 4. The outer wheel 310 is positioned on the outer peripheral surface of the inner wheel 510. That is, the inner wheel 510 is positioned on the inner peripheral surface of the outer wheel 310.

A material of the outer wheel 310 may be any one of metal, non-metal, ceramic, and plastic.

The outer wheel 310 includes the outer guide grooves 313 and 315. A first outer wheel guide groove 315 and a second outer wheel guide groove 313 are positioned on the inner peripheral surface of the outer wheel 310 and correspond to a first inner wheel guide groove 515 and a second inner wheel guide groove 513 of the inner wheel 510, respectively.

The first outer wheel guide groove 315 may be at least one, and the first outer wheel guide groove 315 is formed in a ring shape which is oblique to a lower or upper circumferential surface of the outer wheel 310 and may be arranged to form a plurality of columns.

The first outer wheel guide groove 315 which is obliquely formed has a height different from the upper or lower circumferential surface of the outer wheel 310. A distance between the first outer wheel guide groove 315 and the lower circumferential surface of the outer wheel 310 is changed. A distance between the first outer wheel guide groove 315 and the upper circumferential surface of the outer wheel 310 is also changed similarly.

In other words, the first outer wheel guide groove 315 is formed to have a spaced distance which is changed with respect to the lower circumferential surface of the outer wheel 310. However, when the first outer wheel guide groove 315 forms a closed curve in a ring shape, points having the same spaced distance with respect to the lower or upper circumferential surface of the outer wheel 310 may be at least two.

The distance between the first outer wheel guide groove 315 and the upper or lower circumferential surface of the outer wheel 310 is not limited, which is similar to a case that a degree at which the ring-shaped first outer wheel guide groove 315 is inclined to the circumferential surface of the outer wheel 310 is not limited. According to the first outer wheel guide groove 315 which is largely inclined, a vertical movement range of the ball 750 that moves on the first outer wheel guide groove 315 is comparatively large and according to the first outer wheel guide groove 315 which is slightly inclined, the vertical movement range of the ball 750 that moves on the first outer wheel guide groove 315 is a little smaller.

The second outer wheel guide groove 313 may be at least one, and the second outer wheel guide groove 313 is formed in a ring shape parallel to the lower or upper circumferential surface of the outer wheel 310. That is, a distance between the second outer wheel guide groove 313 and the lower or upper circumferential surface of the outer wheel 310 is similar even at any point.

The first outer wheel guide groove 315 and the second outer wheel guide groove 313 of the outer wheel 310 are formed in a structure in which the first inner wheel guide groove 515 and the second inner wheel guide groove 513 of the inner wheel 510 face each other. Two corresponding guide grooves form movement spaces of the ring-shaped balls 730 and 750 while facing each other. That is, the balls 730 and 750 are positioned in spaces between the first outer wheel guide groove 315 and the second outer wheel guide groove 313, and between the first inner wheel guide groove 515 and the second inner wheel guide groove 513 that correspond to each other.

The first outer wheel guide groove 315 and the second outer wheel guide groove 313 may be plural while corresponding to the first inner wheel guide groove 515 and the second inner wheel guide groove 513.

As one example, one first outer wheel guide groove 315 and two second outer wheel guide grooves 313 may be provided as illustrated in FIG. 4. The reason is that the first outer wheel guide groove 315 and the second outer wheel guide groove 313 correspond to the first inner wheel guide groove 515 and the second inner wheel guide groove 513 illustrated in FIGS. 2 and 3.

Further, the arrangement or order of the plurality of first outer wheel guide grooves 315 and the plurality of second outer wheel guide grooves 313 is not limited to the arrangement or order illustrated in FIG. 4 and positions thereof may be, of course, changed and the first outer wheel guide grooves 315 and the second outer wheel guide grooves 313 correspond to the first inner wheel guide grooves 515 and the second inner wheel guide grooves 513.

In FIG. 4, one first outer wheel guide groove 315 is inclined to the upper or lower circumferential surface of the outer wheel 310, but of course, the present invention is not limited thereto. The plurality of first outer wheel guide grooves 315 may be formed to have a height different from the lower circumferential surface of the outer wheel 310. Even in this case, the plurality of first outer wheel guide grooves 315, of course, correspond to the plurality of first inner wheel guide grooves 515.

Referring to FIG. 4, the outer wheel 310 may further include a joining groove 317 that is positioned on the outer peripheral surface of the outer wheel 310. The joining groove 317 couples the outer wheel 310 and the housing 110 and any types to join the outer wheel 310 and the housing 110 may be allowed. In one embodiment of the present invention, the joining groove 317 may be circular.

The outer wheel 310 may further include a projection 319 that is joined with the housing 110 to be described below. As illustrated in FIG. 4, the projection 319 is positioned at both ends of the outer peripheral surface of the outer wheel 310 and is projected from the outer peripheral surface between both ends by a predetermined thickness. The housing 110 further includes a groove that is joinable with and corresponds to the projection.

The joining groove 317 and the projection 319 are components for coupling the housing 110 and the outer wheel 310 and the outer wheel 310 includes at least one of the joining groove 317 and the projection 319.

The present invention includes the balls 730 and 750, and as illustrated in FIG. 1, the balls 730 and 750 are positioned between the outer wheel 310 and the inner wheel 510. In more detail, the balls 730 and 750 are positioned between the guide grooves 313 and 315 of the outer wheel 310 and the guide grooves 513 and 515 of the inner wheel 510. The plurality of balls 730 and 750 are positioned in a ring-shaped ball movement space formed by the corresponding guide grooves of the outer wheel 310 and the inner wheel 510 and support the movement of the inner wheel 510 on the inner peripheral surface of the outer wheel 310.

The plurality of balls 730 are positioned between the second inner wheel guide groove 513 and the second outer wheel guide groove 313 that are formed on the circumferential surface in parallel, and transfer rotation by the rotational shaft and distribute a friction point. The ball 730 may rotate in a space between the second inner wheel guide groove 513 and the second outer wheel guide groove 313 that are formed in parallel to the circumferential surfaces of the outer wheel 310 and the inner wheel 510.

At least one ball 750 rotates in a space between the first inner wheel guide groove 515 and the first outer wheel guide groove 315 that are formed obliquely to the lower circumferential surface of the inner wheel 510 or the outer wheel 310.

The outer wheel 310 and the inner wheel 510 rotate independently from each other without interference of interrotation of the outer wheel 310 and the inner wheel 510 by the plurality of balls 730 and 750. That is, the inner wheel 510 is rotated by rotational force of a shaft inserted into the rotational shaft, and the outer wheel 310 is rotated by friction force with the substrate.

The retainer 610 is positioned between the balls 730, and in particular, as illustrated in FIG. 6, the retainer 610 is positioned at both ends of a circumferential surface where the outer wheel 310 and the inner wheel 510 abut on each other. The plurality of balls 730 may be positioned in the retainer 610 and thus, loads applied from the outer wheel and the inner wheel are distributed.

The retainer 610 is formed in such a manner that the plurality of balls 730 that rotates in the space between the second inner wheel guide groove 513 and the second outer wheel guide groove 313 that are formed in parallel to the circumferential surfaces of the outer wheel 310 and the inner wheel 510 is maintained at regular intervals. The plurality of balls 730 is positioned in the ring-shaped ball movement space formed by the guide grooves which are parallel to the inner wheel 510 and the outer wheel 310, and the retainer 610 makes the plurality of balls 730 be maintained at regular intervals.

Referring to FIG. 1, the retainer 610 is positioned between the outer wheel 310 and the inner wheel 510 and may have any shape to maintain the intervals of the plurality of balls 730, but as one example of the present invention, a ring-shaped retainer 610 having holes inserted with the balls 730 may be provided as illustrated in FIG. 6.

The housing 110 is positioned outside the aforementioned components and has a hollow cylindrical shape. An inner peripheral surface of the housing 110 is joined with the outer peripheral surface of the outer wheel, and as one example, the inner peripheral surface of the housing 110 has a groove to be coupled with the projection 319 positioned on the outer peripheral surface of the outer wheel 310. Both ends of the inner peripheral surface of the housing 110 may have grooves having a predetermined thickness to be joined with the projection. Therefore, as one example of the present invention, the both ends of the inner peripheral surface of the housing 110 are coupled in a circumferential direction along the outer peripheral surface of the outer wheel 310.

As a material of the housing 110, any material which is low in friction force with the substrate and low in wear may be used and as one example of the present invention, any one of metal, non-metal, ceramic, and plastic may be used.

One embodiment includes the housing 110 and in one embodiment the housing 110 contacts the substrate, but the side roller 100 in which the outer wheel 310 serves as an external surface of the side roller 100 like the housing 110 without the housing 110 may also be used.

Hereinafter, an operation of the side roller 100 according to an embodiment of the present invention that includes the aforementioned components will be described.

When the ball 750 that moves on a route formed by the first inner wheel guide groove 515 and the first outer wheel guide groove 315 moves higher than a circumferential surface positioned at the center in the longitudinal direction of the inner wheel 510 or the outer wheel 310, the outer wheel 310 or the housing 110 joined therewith is positioned slightly high and when the ball 750 moves lower than the circumferential surface, the outer wheel 310 or the housing 110 joined therewith is positioned a little low.

The ball 750 performs a rotating motion to be positioned higher or lower than the circumferential surface of the inner wheel 510 or the outer wheel 310 while continuously rotating. Therefore, the outer wheel 310 or the housing 110 connected with the ball 750 moves also vertically. The housing 110 that moves vertically has various contact points with the transported substrate to prevent a gap or wear from occurring on the surface of the housing 110 while contacting the substrate through one contact point.

In particular, when the side roller 100 is used in the substrate transport device 10, the housing 110 rotates through contact while contacting the transported substrate. The housing 110 moves up and down vertically to the circumferential direction of the housing 110 while rotating by the substrate. That is, in the case of the side roller 100 of the substrate transport device 10, as the housing 110 moves up and down, a surface of the housing 110 that contacts the substrate is continuously changed. Accordingly, the surface of the housing 110 that is worn by the contact with the substrate is decreased to increase a persistent period of the side roller 100 and decrease a fault by the transportation of the substrate.

Hereinafter, a wear amount depending on the side roller will be described with reference to FIGS. 7 to 9.

FIG. 7A is a cross-sectional view of a side roller according to a comparative example and FIG. 7B is a cross-sectional view of the side roller according to an embodiment of the present invention. A test of the wear amount by the transportation for the aforementioned two side rollers is performed.

Figure 7:
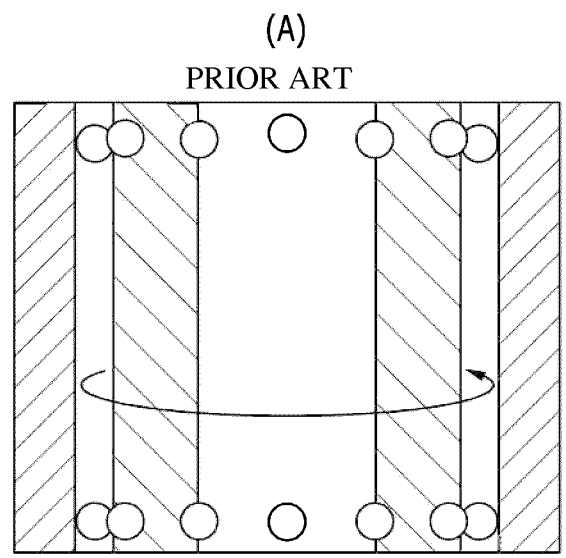
FIG. 7A is a cross-sectional view of a side roller according to a comparative example and FIG. 7B is a cross-sectional view of the side roller according to an embodiment of the present invention.
Figure 7:
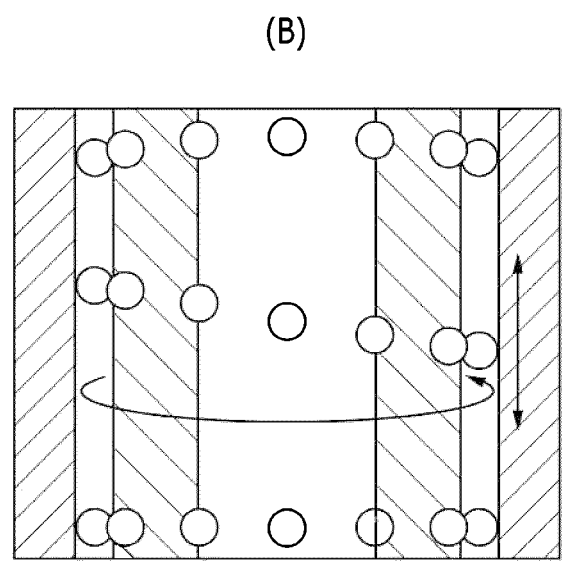
Figure 8:
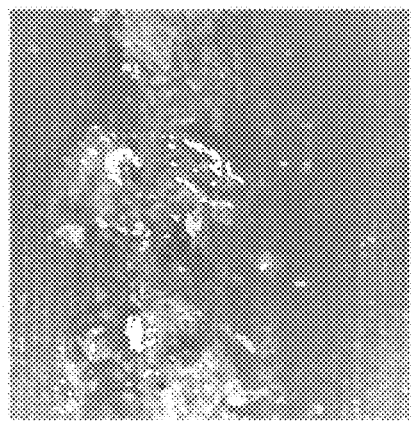
FIGS. 8A, 8B and 8C illustrate a result of a wear test of FIG. 7A.
Figure 8:
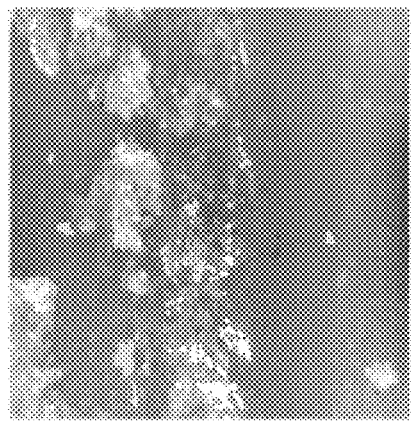
Figure 8:
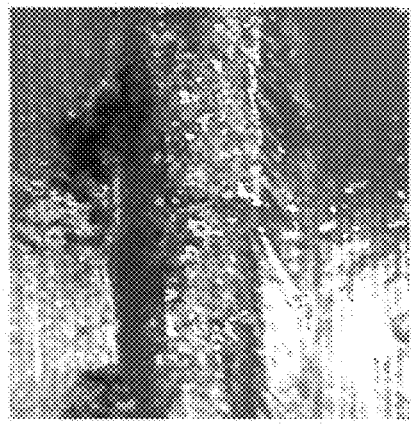
Figure 9:
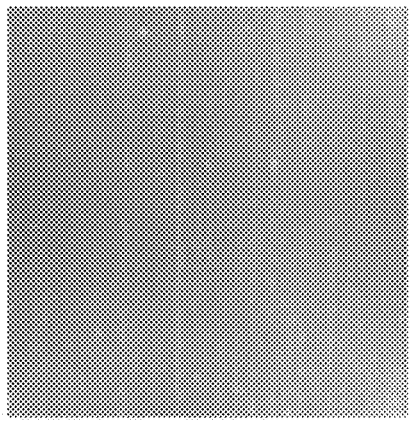
FIGS. 9A, 9B and 9C illustrate a result of a wear test of FIG. 7B.
Figure 9:
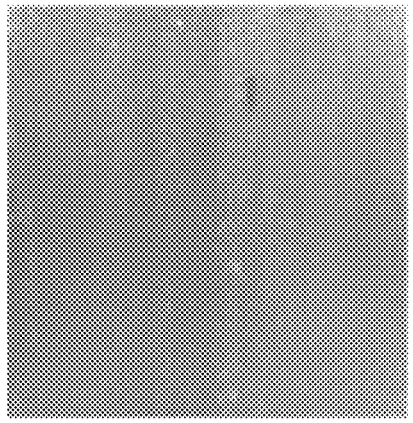
Figure 9:
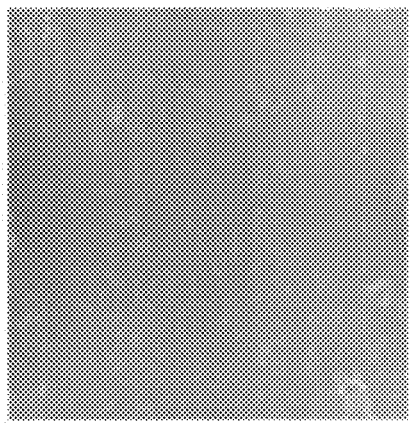

As a result thereof, FIG. 8 illustrates a test result of FIG. 7A and FIG. 9 illustrates a test result of FIG. 7B. In detail, FIGS. 8A and 9A, 8B and 9B, and 8C and 9C illustrate test results in which the substrate transportation is performed at 2,000 times, 10,000 times, and 20,000 times, respectively.

First, referring to FIG. 8, it is observed that an impact point occurs in the side roller when the transportation is performed approximately 2,000 times and an impact band is formed to some degree when the transportation is performed 10,000 times. In particular, it can be seen that a groove is formed on the surface with reference to (C) in which the transportation is performed approximately 20,000 times.

When a wear gap occurs in the side roller as illustrated in FIG. 8, the substrate may engage in the side roller at the time of transporting the substrate, and as a result, a substrate fault occurs.

In contrast, referring to a result of FIG. 9 according to an embodiment of the present invention, only a minute surface scratch is formed throughout 2,000 times, 10,000 times, and 20,000 times, but the impact band or surface groove that is observed in FIG. 8 is not observed, Therefore, it is verified that in the side roller according to an embodiment of the present invention, the surface wear by the transportation of the substrate is remarkably decreased.

Additionally, the wear amounts of the respective side rollers illustrated in FIG. 7 are numerically analyzed. In detail, the wear amount of each side roller is calculated by (load× distance)/surface hardness.

First, the wear amount is calculated under the assumption that the daily average number of transportation times of the side roller according to the comparative example of FIG. 7A is 1,500 times. 94 days are required to form wear of 0.05 mm and approximately 189 days are required to form wear of 0.10 mm.

In contrast, it can be seen that when the wear amount is calculated under the assumption that the daily average number of transportation times of the side roller according to the embodiment of the present invention of FIG. 7B is 1,500 times, it can be seen that 2,692 days are required to form wear of 0.05 mm and approximately 5,385 days are required to form wear of 0.1 mm.

Therefore, the side roller according to an embodiment of the present invention may be used for a longer time than that of the comparative example by approximately 28 times. That is, the persisting period of the side roller significantly increases and a foreign-material fault of the side roller decreases, and as a result, the substrate fault also decreases.

When a monthly prospective consumption amount is estimated as 2,000 with an increase in replacement cycle of the side roller, yearly part cost and yearly labor cost will be saved by 0.72 billion won and approximately 0.12 billion won, respectively. Therefore, according to the exemplary embodiment of the present invention, it is anticipated that the part cost and the labor cost are significantly saved.

Figure 10:
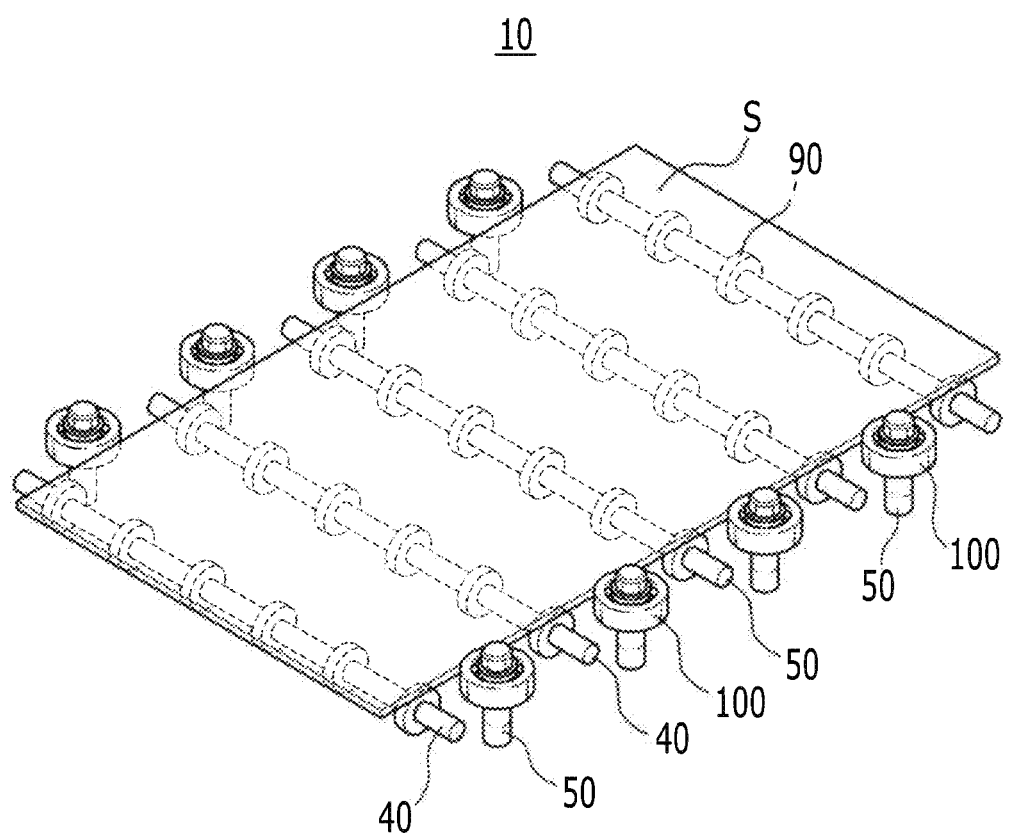
FIG. 10 is a perspective view of a substrate transport device according to an embodiment of the present invention.

Hereinafter, the substrate transport device 10 according to an embodiment of the present invention will be described with reference to FIG. 10.

An embodiment of the present invention provides the substrate transport device 10 including the aforementioned side roller 100. FIG. 10 is a perspective view of a substrate transport device 10.

The substrate transport device 10 includes a first shaft 40, a second shaft 50, a transport roller 90, and a side roller 100.

The first shaft 40 is rotatable, and rotates together with the transport roller 90 to transport a substrate S in a desired straight direction. The first shaft 40 and the transport roller 90 also serve to support the substrate S. The first shaft 40 may be provided in plural and the plurality of first shafts 40 is disposed in parallel to each other as illustrated in FIG. 10.

The second shaft 50 is vertical to the longitudinal direction of the first shaft 40 and is positioned at both ends of the first shaft 40. The second shaft 50 guides straight movement of the substrate transported by the first shaft 40 and the transport roller 90 and prevents the substrate S from swaying from side to side. The substrate is more precisely transported by providing the side roller 100.

The side roller 100 that rotates in connection with the second shaft 50 is rotated by both sides of the substrate S transported by the first shaft 40 and the transport roller 90. In this case, the side roller 100 contacts both sides of the transported substrate S and when the side roller 100 continuously contacts the same plane, an external surface of the side roller 100 may be easily worn. In order to remove such a drawback, in the side roller 100 according to an embodiment of the present invention, while the external surface, that is, the housing moves up and down, a contact surface with the substrate S increases to decrease the wear.

A configuration and an operation side roller 100 are the same as or similar to those of the aforementioned side roller 100. Therefore, a description thereof will be omitted.

In one embodiment, as the substrate S, a rectangular glass substrate used in manufacturing a liquid crystal display panel has been described as an example. However, the spirit of the present invention is not limited thereto and may be applied to all devices that transport substantially rectangular objects in addition to the glass substrate.

Further, only an embodiment in which the substrate S is transported in a horizontal state is described, but the substrate may be transported in an inclined state.

While this invention has been described in connection with certain embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 10: Substrate transport device | 40: First shaft |
| 50: Second shaft | 90: Transport roller |
| 100: Side roller | 110: Housing |
| 310: Outer wheel | 313: Second outer wheel guide groove |
| 315: First outer wheel guide groove | 317: Joining groove |
| 319: Projection | 510: Inner wheel |
| 513: Second inner wheel guide groove | 515: First inner wheel guide groove |
| 517: Center hole | 610: Retainer |
| 730: Ball | 750: Ball |

What is claimed is:

1. A side roller, comprising:
   an inner wheel including at least one first inner wheel guide groove;
   an outer wheel surrounding the at least one inner wheel and including at least one first outer wheel guide groove corresponding to the at least one first inner wheel guide groove; and
   at least one ball positioned between the at least one first inner guide groove and the at least one first outer wheel guide groove,
   wherein a distance between the at least one first inner wheel guide groove and a lower circumferential surface of the at least one inner wheel varies around the lower circumferential surface of the at least one inner wheel.

2. The side roller of claim 1, further comprising:
   a housing coupled with the outer wheel in a circumferential direction.

3. The side roller of claim 2, wherein:
   the outer wheel further includes a joining groove formed on an outer peripheral surface of the outer wheel, and the outer wheel and the housing are joined through the joining groove.

4. The side roller of claim 1, wherein:
   the inner wheel further includes a center hole and is coupled with a rotational shaft through the center hole.

5. The side roller of claim 2, further comprising:
   at least one second inner wheel guide groove and at least one second outer wheel guide groove,
   wherein the at least one second inner wheel guide groove and the at least one second outer wheel guide groove are parallel to a lower circumferential surface of the inner wheel.

6. The side roller of claim 5, wherein:
the housing moves up and down.

7. The side roller of claim 5, further comprising:
a plurality of balls,
a retainer positioned between the plurality of balls.

8. The side roller of claim 2, wherein:
a material of the outer wheel, the inner wheel, and the housing each comprise at least one of metal, non-metal, ceramic, or plastic.

9. A substrate transport device, comprising:
a plurality of rotatable first shafts;
a transport roller that rotates in connection with the plurality of rotatable first shafts;
a second shaft disposed vertical to the longitudinal direction of the plurality of rotatable first shafts; and
a side roller that rotates in connection with the second shaft, wherein the side roller includes:
 an inner wheel including at least one first inner wheel guide groove,
 an outer wheel surrounding the inner wheel and including at least one first outer wheel guide groove corresponding to the at least one first inner wheel guide groove, and
 at least one ball positioned between the at least one first inner wheel guide groove and the at least one first inner wheel guide groove,
 wherein a distance between the at least one first inner wheel guide groove and a lower circumferential surface of the inner wheel varies around the lower circumferential surface of the at least one inner wheel;
 wherein an external surface of the side roller moves up and down.

10. The substrate transport device of claim 9, wherein:
the side roller further includes a housing coupled with the outer wheel in a circumferential direction.

11. The substrate transport device of claim 10, wherein:
the outer wheel further includes a joining groove formed on an outer peripheral surface of the outer wheel, and the outer wheel and the housing are joined through the joining groove.

12. The substrate transport device of claim 9, wherein:
the inner wheel further includes a center hole and is coupled with a rotational shaft through the center hole.

13. The substrate transport device of claim 9, wherein:
the side roller further includes at least one second inner wheel guide groove and at least one second outer wheel guide groove,
wherein the at least one second inner wheel guide groove and the at least one second outer wheel guide groove are parallel to a lower circumferential surface of the inner wheel.

14. The substrate transport device of claim 10, wherein:
the housing moves up and down.

15. The substrate transport device of claim 13 comprising:
a plurality of balls, wherein the side roller further includes a retainer positioned between the plurality of balls.

16. The substrate transport device of claim 10, wherein:
a material of the outer wheel, the inner wheel, and the housing each comprises at least one of metal, non-metal, ceramic, or plastic.

* * * * *